United States Patent [19]

Strobl

[11] Patent Number: 6,121,098

[45] Date of Patent: Sep. 19, 2000

[54] SEMICONDUCTOR MANUFACTURING METHOD

[75] Inventor: Peter Strobl, Glen Allen, Va.

[73] Assignee: Infineon Technologies North America Corporation, San Jose, Calif.

[21] Appl. No.: 09/107,672

[22] Filed: Jun. 30, 1998

[51] Int. Cl.[7] .................................................. A01L 21/336
[52] U.S. Cl. ...................... 438/301; 438/233; 438/636; 438/637; 438/618; 438/624; 438/717; 438/724; 438/734; 438/700; 438/952
[58] Field of Search ..................... 438/233, 301, 438/636, 637, 618, 624, 717, 724, 734, 700, 952

[56] References Cited

U.S. PATENT DOCUMENTS

| | | |
|---|---|---|
| 4,378,628 | 4/1983 | Levinstein et al. . |
| 5,206,187 | 4/1993 | Dona et al. . |
| 5,378,659 | 1/1995 | Roman et al. . |
| 5,468,342 | 11/1995 | Nulty et al. . |
| 5,518,962 | 5/1996 | Murao . |
| 5,578,524 | 11/1996 | Fusake et al. . |
| 5,661,344 | 8/1997 | Havemann et al. . |
| 5,841,195 | 11/1998 | Lin et al. . |
| 5,882,999 | 3/1999 | Anderson et al. . |
| 5,920,796 | 6/1999 | Wang et al. . |
| 5,922,622 | 7/1999 | Lee et al. . |
| 5,976,966 | 11/1999 | Inoue . |

*Primary Examiner*—Richard Booth
*Assistant Examiner*—Jonathan Hack
*Attorney, Agent, or Firm*—Robert A. Whitman

[57] ABSTRACT

A method for forming a semiconductor device includes providing a semiconductor body having source and drain regions therein and a gate electrode on a portion of a surface of such body between the source and drain regions. A dielectric layer is provided on the surface of the semiconductor body over the source and drain regions. A dielectric material is formed over the dielectric layer and over the gate electrode. An inorganic, dielectric layer is formed over the semiconductor body dielectric material. The inorganic, dielectric layer is patterned into a mask to expose selected portions of the dielectric material, such portions being over the source and drain regions. An etch is brought into contact with the mask. The etch removes the exposed underlying portions of the dielectric material and exposed underling portions of the dielectric layer to thereby expose the portions of the source and drain regions.

3 Claims, 2 Drawing Sheets

SEMICONDUCTOR MANUFACTURING METHOD

BACKGROUND OF THE INVENTION

This invention relates generally to semiconductors and more particularly to methods for making semiconductor devices.

As is known in the art, semiconductor devices are used in a wide variety of applications. One such device is a metal oxide semiconductor field effect transistor (MOSFET). Such device includes a gate electrode for controlling the flow of carriers between source and drain regions formed in a semiconductor, typically silicon, body. The gate electrode typically is formed on a thin thermally grown silicon dioxide layer over a gate region of the semiconductor body which is disposed between the source and drain regions. A layer of doped polycrystalline silicon is formed on the gate oxide. A layer of metal, such as tungsten silicide, is formed over the doped polycrystalline silicon to provide, with the doped polycrystalline silicon, a gate electrode for the MOSFET. After this gate electrode is formed, dopant is implanted into the silicon body to provide the source and drain regions. This gate electrode is covered with an insulator, or dielectric, of silicon nitride. More particularly, after forming the source and drain regions, a series of process steps are performed with the result that a layer of silicon nitride is formed on top of the tungsten silicide (i.e., a silicon nitride cap for the gate electrode), silicon nitride spacers are formed over the sides of the gate electrode, and a layer of silicon oxynitride is formed on the silicon body over the doped source and drain regions and over the silicon nitride sidewall spacers and cap.

The resulting structure is shown in FIG. 1. More particularly, the silicon substrate 10 has a thermally grown silicon dioxide layer 12. The gate electrode 13 includes a doped polycrystalline silicon layer 14 on the layer 12 and a tungsten silicide layer 16 on the doped polycrystalline silicon layer 14 to form a gate electrode 13. Thus, the gate region 18 under gate electrode 13 is between the source and drain regions S, D. It is noted that a silicon nitride cap 20a and sidewall spacers 20b are over gate electrode 13, and a silicon oxynitride layer 20c is over the source and drain regions, S, D and over the silicon nitride cap 20a and sidewall spacers 20b, as shown.

Next, a dielectric layer 22 of, here for example, phosphor doped silicate glass (BSPG) is deposited over the structure and chemical mechanically polished back to the top of the dielectric layer 20c on the gate electrode 13, as shown in FIG. 1. An oxide layer 24, here TEOS, is deposited over the structure. Next an antireflection coating (ARC) 26 is deposited over the TEOS layer 24. The ARC 26 is an organic material, e.g. a polymer used to absorb ultra violet light. A photoresist layer 28 is then deposited over the ARC 26. A mask, not shown, is placed over the photoresist layer 28, and exposed to the ultra violet light. The photoresist layer 28 is developed to provide the mask shown in FIG. 1. Next, the structure is exposed to an etch to open the exposed portions of the ARC layer 26, here the etch is a reactive ion etch (RIE) using a $N_2$ and $O_2$ chemistry. Next, the exposed portions of the TEOS layer 24 is RIE with $C_4F_8$ and CO and argon and oxygen chemistry. Next, the exposed portions of the BSPG dielectric layer 22 is etched using an RIE with a $C_4F_8$ and CO and argon chemistry. This RIE stops when in contact with the silicon oxynitride layer 20c. Next, the exposed portions of the silicon oxynitride layer 20c are RIE using $CF_4$ and $CHF_3$ chemistry to thus expose portions of the source and drain regions S, D for source and drain electrical contacts, not shown.

As is known, one etch typically used is a reactive ion etch (RIE) having a fluoride base (e.g., $C_4F_8$). However, such etch chemistry is strongly dependent and influenced by the material used for the photoresist layer.

As is also known in the art, one technique suggested has been to use a layer of polycrystalline silicon over the TEOS layer prior to the deposition of the ARC layer. However, because the polycrystalline silicon is conductive it must be removed.

SUMMARY OF THE INVENTION

In accordance with the present invention, a method is provided for forming a semiconductor device. The method includes providing a semiconductor body having source and drain regions therein and a gate electrode on a portion of a surface of such body between the source and drain regions. A dielectric layer is provided on the surface of the semiconductor body over the source and drain regions. A dielectric material is formed over the dielectric layer and over the gate electrode. An inorganic, dielectric layer is formed over the semiconductor body dielectric material. The inorganic, dielectric layer is patterned into a mask to expose selected portions of the dielectric material, such portions being over the source and drain regions. An etch is brought into contact with the mask. The etch removes the exposed underlying portions of the dielectric material and exposed underling portions of the dielectric layer to thereby expose the portions of the source and drain regions.

With such method, the use of an inorganic, dielectric mask to etch the dielectric material enables the use of a wide variety of photoresist materials. Further, because the mask is dielectric, it is not necessary to remove it after the formation of the source and drain electrical contacts.

In accordance with another feature of the invention, a method for forming a semiconductor device is provided. The method includes providing a semiconductor body having source and drain regions therein and a gate electrode on a portion of a surface of such body between the source and drain regions. A dielectric layer is formed on the surface of the semiconductor body over the source and drain regions. A dielectric material is formed over the dielectric layer and over the gate electrode. An inorganic, dielectric layer is formed over the dielectric material. An antireflection coating is formed over the inorganic, dielectric layer. A patterned photoresist layer is formed over the antireflection coating. The patterned photoresist layer has openings therein to expose portions of the antireflection coating disposed over portions of the source and drain regions. A mask is formed by bringing an etch into contact with the exposed portion of the antireflection coating to remove such exposed portions and to remove portions of the inorganic, dielectric layer exposed by the removed portions of the antireflection coasting such mask exposing underlying portions of the dielectric material. The photoresist layer is removed. An etch is brought into contact with the mask, such etch removing the exposed underlying portions of the dielectric material and exposed underling portions of the dielectric layer to expose the portions of the source and drain regions. Source and drain electrical contacts are formed to the exposed portions of the source and drain regions.

BRIEF DESCRIPTION OF THE DRAWING

Other features of the invention, as well as the invention itself, will be more fully understood from the following detailed description taken together with the accompanying drawings, in which.

DESCRIPTION OF THE PREFERRED EMBODIMENTS

Figure 1:
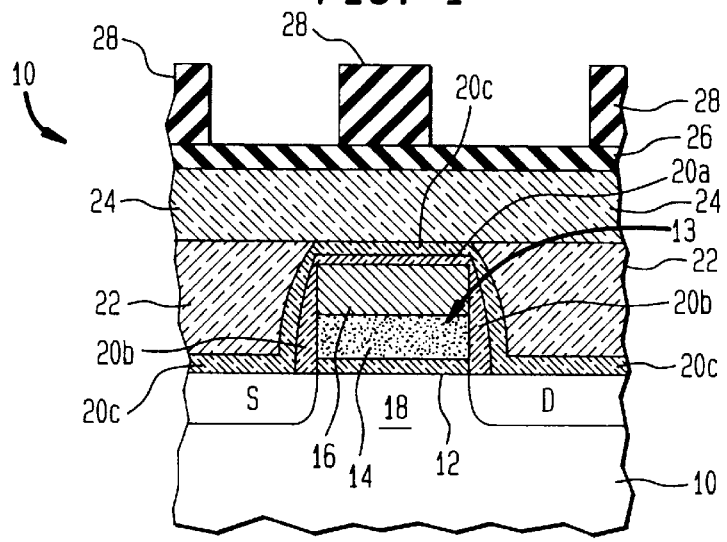
FIG. 1 is a diagrammatical sketch of a semiconductor at a stage in the fabrication thereof according to the prior art.
Figure 2A:
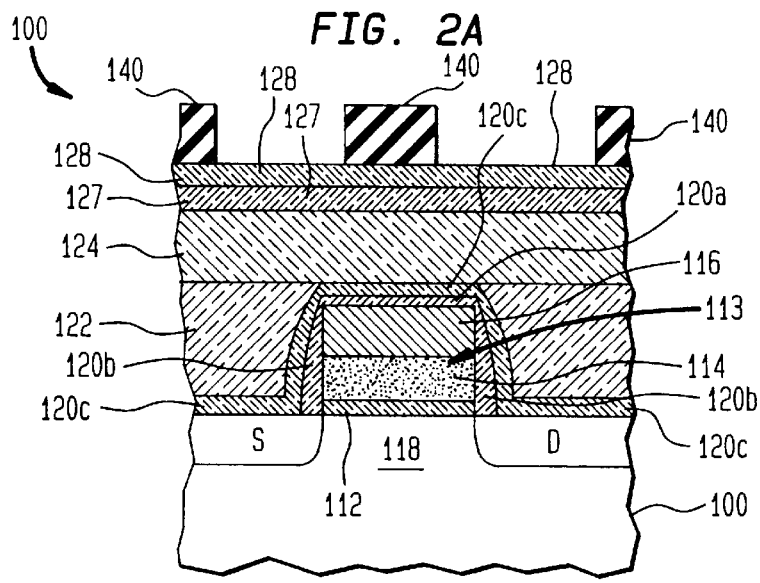
FIGS. 2A–2D are diagrammatical sketches of a semiconductor device at a stage in the fabrication thereof according to the invention.

Referring now to FIG. 2A, a semiconductor, here silicon body or substrate 100 is shown having a source region, S, and a drain region, D formed therein. A gate electrode 113 is formed on a portion of a surface of such substrate between the source and drain regions, S and D. More particularly, the silicon substrate 100 has a thermally grown silicon dioxide layer 112, here having a thickness of about 8 nanometers (nm). The gate electrode 113 includes a doped polycrystalline silicon layer 114, here having a thickness of about 100 nm, on the silicon dioxide layer 112 and a tungsten silicide layer 116, here having a thickness of about 55 nm, on the doped polycrystalline silicon layer 114 to form the gate electrode 113. Thus, the gate region 118 under gate electrode 113 is between the source and drain regions S, D. It is noted that a silicon nitride cap 120a and sidewall spacers 120b are over gate electrode 113, and a silicon oxynitride layer 120c is over the source and drain regions, S, D and over the silicon nitride cap 120a and sidewall spacers 120b. It is noted that the portion of the silicon oxynitride layer 120c over the source and drain regions, S, D is here has a thickness of about 23 nanometers (nm). Here, the thickness of the dielectric cap layer 120a and silicon oxynitride layer 120c together on the gate electrode 113 have a total thickness of about 200 nm.

Next, a dielectric layer 122 of, here for example, phosphor doped silicate glass (BSPG) is deposited over the structure and chemically mechanically polished back to the top of the dielectric layer 120c on the gate electrode 113, as shown. After the etch back, the thickness of the BPSG 122 is the same as the height of the gate electrode 113 with the cap and silicon oxynitride portions 120a, 120c thereon. An oxide layer 124, here TEOS, is deposited over the structure, here to a thickness of about 450 nm.

Next, an inorganic, dielectric layer 127 is formed over the TEOS dielectric layer 124. Here the inorganic, dielectric layer 127 is silicon nitride having a minimum thickness of 150 nm. The silicon nitride layer 127 is deposited with plasma enhanced chemical vapor deposition. Next, an inorganic antireflection coating (ARC) 128 is formed over the inorganic, dielectric layer 127. Here the ARC 128 is silicon oxynitride having a thickness of about 30 to 70 nm. The ARC 128 is formed by plasma enhanced chemical vapor deposition and has a thickness selected to provide, with the thickness of the silicon nitride layer 127, the requisite absorption to ultraviolet light.

Next, a layer 140 of photoresist is deposited over the antireflection coating 128 and patterned with a mask, not shown, after exposure to ultraviolet light and a developing process, to have openings therein to expose portions of the antireflection coating 128 disposed over portions of the source and drain regions, S, D.

Figure 2B:
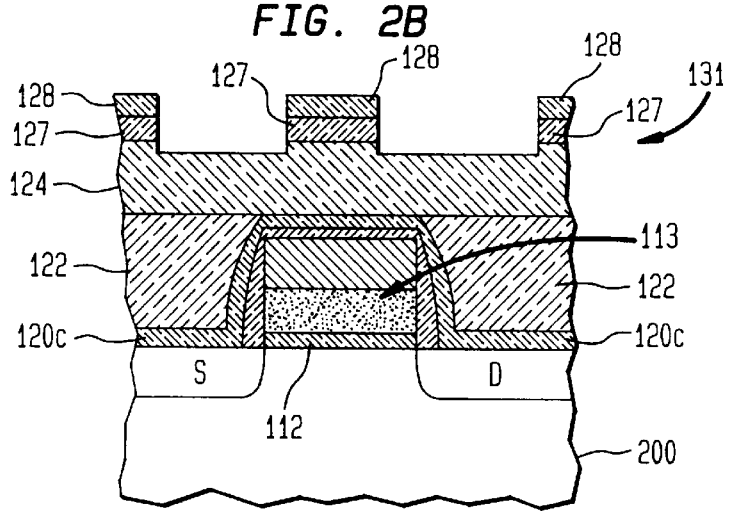

Referring now to FIG. 2B, a mask 131 is formed by bringing an etch into contact the patterned photoresist layer 140. Here, the etch is a reactive ion etch having a nitride etch chemistry, here RIE with a $CF_4$ and $O_2$ and argon chemistry. The etch removes the exposed portion of the antireflection coating 128 and portions of the inorganic, dielectric layer 127 exposed by the removed portions of the antireflection coasting 128. It is noted that the etch is timed to stop within the TEOS layer 124. Thus, the such mask 131 formed by the etched ARC 128 and etched inorganic, dielectric layer 127 exposes underlying portions of the TEOS dielectric layer 124.

The photoresist layer 140 (FIG. 2A) is removed. The structure masked by mask 131 is then brought into contact with an etch, here, the etch is a reactive ion etch having a $C_4F_8$ and argon and CO chemistry. It is noted that this chemistry is highly selective and will etch silicon dioxide at a significantly faster rate than the etch rate of silicon nitride or silicon oxynitride. Thus, with the mask 131 formed by the etched ARC 128 and etched inorganic, dielectric layer 127, the exposed portions of the TEOS dielectric layer 124 are removed. The etch also removes the exposed underlying portions of the BSPG dielectric material 122. The etch then stops. Next, an RIE with a $CHF_3$ and oxygen chemistry and, if required, $CF_4$, removes the exposed underling portions of the silicon oxynitride layer 120c to expose the portions of the source and drain regions, S, D. It is noted that the ARC 128 is removed during the high selectivity RIE etch using the $C_4F_8$ and argon and CO chemistry, thereby producing the structure shown in FIG. 2C. It is noted that during the etch process, corners 135 of the dielectric layer 120a are removed, or notched as shown.

After the exposure of the source and drain regions, the structure is cleaned to remove polymers which may be produced during RIE processing.

Figure 2C:
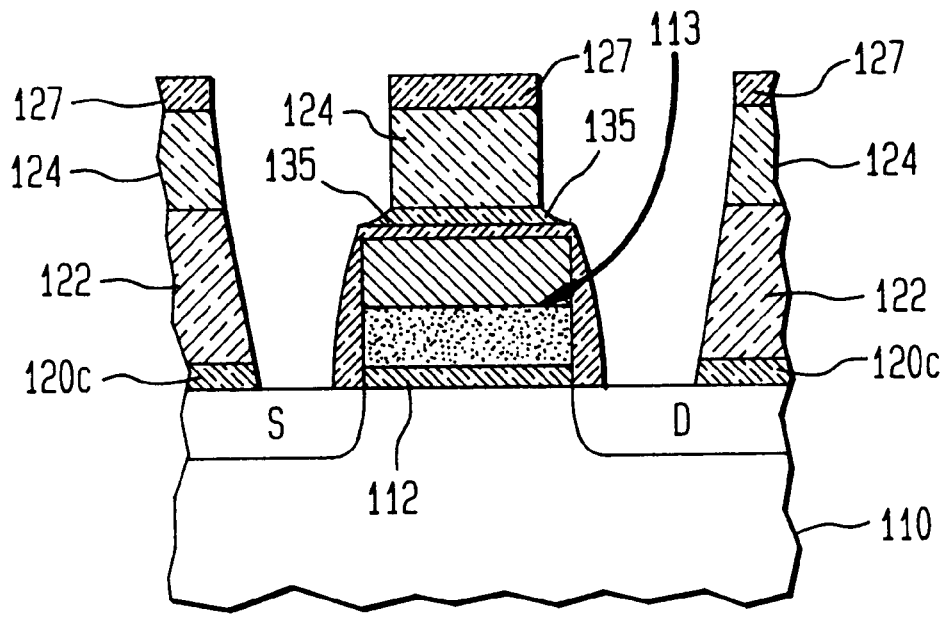
Figure 2D:
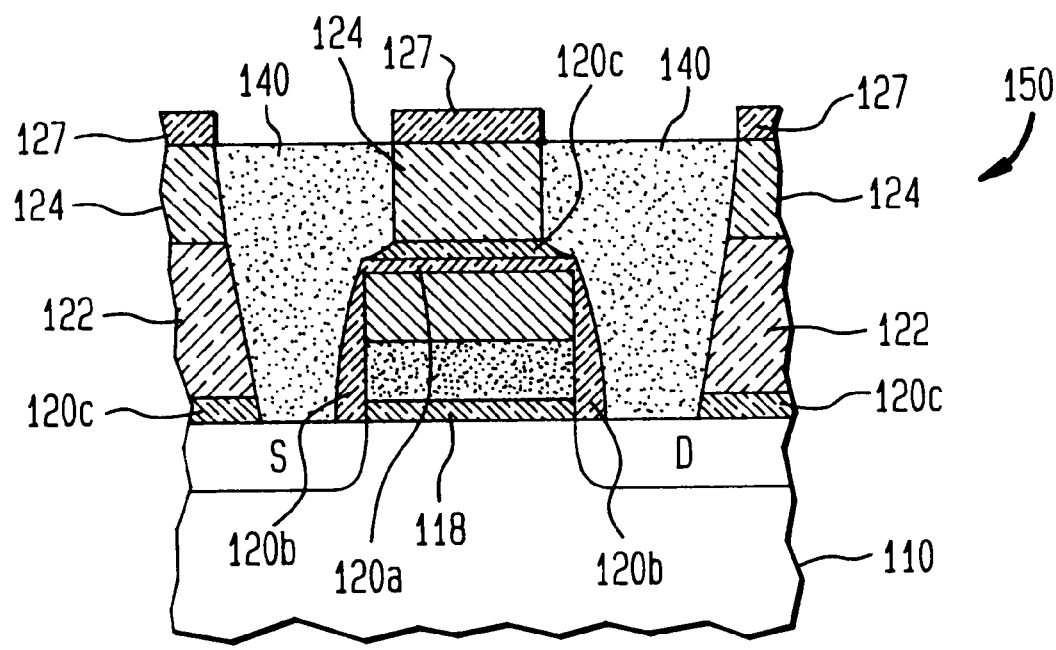

Next, the structure shown in FIG. 2C has deposited over it doped polycrystalline silicon 140, which after conventional etch-back, provides the source and drain region, S, D electrical contacts shown in FIG. 2D for the MOSFET 150.

Other embodiments are within the spirit and scope of the appended claims.

What is claimed is:

1. A method for forming a semiconductor device, comprising:

providing a semiconductor body having source and drain regions therein and a gate electrode on a portion of a surface of such body between the source and drain regions;

forming a dielectric layer on the surface of the semiconductor body over the source and drain regions;

forming dielectric material over the dielectric layer and over the gate electrode;

forming an inorganic, dielectric layer over the dielectric material;

forming an antireflection coating over the inorganic, dielectric layer;

forming a patterned photoresist layer over the antireflection coating, such photoresist layer having openings therein to expose portions of the antireflection coating disposed over portions of the source and drain regions;

forming a mask comprising:
  bringing an etch into contact with the exposed portion of the antireflection coating to remove such exposed portion and to remove portions of the inorganic, dielectric layer exposed by the removed portions of the antireflection coating such mask exposing underlying portions of the dielectric material;

removing the photoresist layer;

bringing an etch into contact with the mask, such etch removing the exposed underlying portions of the dielectric material and exposed underling portions of the dielectric layer to expose the portions of the source and drain regions; and forming source and drain electrical contacts to the exposed portions of the source and drain regions.

2. A method for forming a semiconductor device, comprising:

providing a semiconductor body having source and drain regions therein and a gate electrode on a portion of a surface of such body between the source and drain regions;

forming a dielectric layer on the surface of the semiconductor body over the source and drain regions;

planarizing an upper surface of the dielectric layer;

forming dielectric material over the planarized upper surface of the dielectric layer and over the gate electrode;

forming an inorganic, dielectric layer over the dielectric material;

forming an antireflection coating over the inorganic, dielectric layer;

forming a patterned photoresist layer over the antireflection coating, such photoresist layer having openings therein to expose portions of the antireflection coating disposed over portions of the source and drain regions;

forming a mask comprising:

bringing an etch into contact with the exposed portion of the antireflection coating to remove such exposed portions and to remove portion of the inorganic, dielectric layer exposed by the removed portions of the antireflection coating such mask exposing underlying portions of the dielectric material;

removing the photoresist layer;

bringing an etch into contact with the mask, such etch removing the exposed underlying portions of the dielectric material and exposed underling portions of the dielectric layer to expose the portions of the source and drain regions; and forming source and drain electrical contacts to the exposed portions of the source and drain regions.

3. The method recited in claim 2 wherein the planarizing step comprises chemical mechanically polishing the dielectric layer.

* * * * *